US009167730B2

(12) United States Patent　　(10) Patent No.: US 9,167,730 B2
Tuomola et al.　　(45) Date of Patent: Oct. 20, 2015

(54) ELECTRONICS COMPARTMENT

(75) Inventors: Juha Tuomola, Helsinki (FI); Brian Baldwin, Waukesha, WI (US); Dan Crawley, Muskego, WI (US)

(73) Assignee: ABB TECHNOLOGY OY, Helsinki (FI)

( * ) Notice: Subject to any disclaimer, the term of this patent is extended or adjusted under 35 U.S.C. 154(b) by 183 days.

(21) Appl. No.: 13/551,342

(22) Filed: Jul. 17, 2012

(65) Prior Publication Data

US 2013/0294027 A1　Nov. 7, 2013

Related U.S. Application Data

(63) Continuation-in-part of application No. 13/465,645, filed on May 7, 2012, now abandoned.

(51) Int. Cl.
*H05K 7/20* (2006.01)
*H01L 23/473* (2006.01)

(52) U.S. Cl.
CPC .................................. *H05K 7/20918* (2013.01)

(58) Field of Classification Search
CPC ................. G06F 1/16–1/1654; G06F 1/1656; G06F 1/1662–1/1681; G06F 1/1684–1/189; G06F 1/20; G06F 1/203; G06F 1/206; G06F 2200/021; G06F 2200/202; G06F 2200/203; G06F 1/181–1/182; H05K 5/00; H05K 5/0026; H05K 5/0082; H05K 5/0021; H05K 5/0086–5/06; H05K 5/069; H05K 7/005–7/08; H05K 7/20; H05K 7/00; H05K 7/1422; H05K 1/0218–1/0219; H05K 1/00; H05K 3/00; H05K 9/00; H05K 7/20218–7/20381; H05K 7/20409–7/20418; H05K 7/20009–7/202; H01G 2/00; H01G 4/00; H01G 5/00; H01G 7/00; H01G 9/00–9/155; H01G 11/00; H02G 3/00; H02G 5/00; H02G 7/00; H02G 9/00; H02G 11/00; H02G 13/00; H02G 15/00; H01B 7/00; H01B 11/00; H01B 17/00; H01R 4/00; H01R 9/00; H01R 13/00; H01K 1/00; H01K 3/00; H02B 1/00; H01H 37/00; H01L 23/367–23/3677; H01L 23/473; H01L 23/46–23/467

USPC ............ 361/728, 679, 679.46–679.55, 679.5, 361/679.6, 679.01, 679.02, 679.46–679.54, 361/688–727, 676–678; 454/184; 312/236; 174/547–548, 15.1–15.3, 16.1–16.3; 165/80.4–80.5, 104.33, 185, 165/80.1–80.5; 257/712–722, E23.088; 24/453, 458–459

See application file for complete search history.

(56) References Cited

U.S. PATENT DOCUMENTS 5,467,250 A * 11/1995 Howard et al. ................ 361/696
5,957,194 A *　9/1999 Azar ............................ 165/80.3

(Continued)

FOREIGN PATENT DOCUMENTS

CN　　101794034 A　　8/2010
CN　　102006765 A　　4/2011

(Continued)

OTHER PUBLICATIONS

English translation of Chinese Office Action (First Office Action and Search Report) issued on May 22, 2015, by the State Intellectual Property Office of People's Republic of China. (10 pgs).

*Primary Examiner* — Anthony Haughton
*Assistant Examiner* — Razmeen Gafur
(74) *Attorney, Agent, or Firm* — Buchanan Ingersoll & Rooney PC

(57) ABSTRACT

An electronics compartment with a component space which is sealed off from a surrounding environment by walls, including an internal panel arranged in the component space along a wall of the electronics compartment for delimiting an internal channel between the wall and the internal panel. Air flowing in the internal channel can improve transfer of heat through the wall, and consequently, cools electric components in the component space.

8 Claims, 5 Drawing Sheets

(56) References Cited

U.S. PATENT DOCUMENTS

| | | | | |
|---|---|---|---|---|
| 6,104,003 | A * | 8/2000 | Jones | 219/400 |
| 6,351,381 | B1 * | 2/2002 | Bilski et al. | 361/695 |
| 6,462,944 | B1 * | 10/2002 | Lin | 361/679.5 |
| 6,494,252 | B1 * | 12/2002 | Takala et al. | 165/104.33 |
| 6,611,428 | B1 * | 8/2003 | Wong | 361/695 |
| 6,917,522 | B1 * | 7/2005 | Erturk et al. | 361/700 |
| 7,011,148 | B1 * | 3/2006 | Calanni et al. | 165/165 |
| 7,128,310 | B2 * | 10/2006 | Mockry et al. | 261/112.1 |
| 7,180,737 | B2 * | 2/2007 | Straub et al. | 361/690 |
| 7,222,660 | B2 * | 5/2007 | Giacoma et al. | 165/47 |
| 7,245,485 | B1 * | 7/2007 | Morrell | 361/679.48 |
| 7,298,619 | B1 * | 11/2007 | Malone et al. | 361/699 |
| 7,418,995 | B2 * | 9/2008 | Howard et al. | 165/80.3 |
| 7,522,413 | B2 * | 4/2009 | Yu et al. | 361/679.02 |
| 7,646,603 | B2 * | 1/2010 | Bard et al. | 361/696 |
| 7,706,142 | B2 * | 4/2010 | Noisternig et al. | 361/695 |
| 7,753,766 | B2 * | 7/2010 | Master et al. | 454/184 |
| 7,791,883 | B2 * | 9/2010 | Lin | 361/700 |
| 7,864,523 | B2 * | 1/2011 | Iwakiri | 361/679.49 |
| 7,957,139 | B2 * | 6/2011 | Davis et al. | 361/690 |
| 8,144,459 | B2 * | 3/2012 | Ji et al. | 361/679.47 |
| 8,325,479 | B2 * | 12/2012 | Siracki et al. | 361/679.5 |
| 8,599,540 | B2 * | 12/2013 | Fernandez | 361/679.01 |
| 8,634,193 | B2 * | 1/2014 | Zhou et al. | 361/695 |
| 2001/0052412 | A1 * | 12/2001 | Tikka | 165/299 |
| 2003/0085025 | A1 * | 5/2003 | Woods et al. | 165/104.33 |
| 2003/0155110 | A1 * | 8/2003 | Joshi et al. | 165/185 |
| 2004/0022028 | A1 * | 2/2004 | Hildebrandt | 361/700 |
| 2004/0042175 | A1 * | 3/2004 | Kehret et al. | 361/690 |
| 2005/0252024 | A1 * | 11/2005 | Knight et al. | 34/202 |
| 2006/0044758 | A1 * | 3/2006 | Spangberg | 361/695 |
| 2007/0144708 | A1 * | 6/2007 | Tilton et al. | 165/104.31 |
| 2007/0199204 | A1 * | 8/2007 | Knight et al. | 34/428 |
| 2008/0017355 | A1 * | 1/2008 | Attlesey et al. | 165/104.33 |
| 2008/0117591 | A1 * | 5/2008 | Hashikura et al. | 361/694 |
| 2008/0278912 | A1 * | 11/2008 | Zavadsky et al. | 361/697 |
| 2011/0024150 | A1 * | 2/2011 | Subramaniam et al. | 174/15.1 |
| 2011/0198062 | A1 * | 8/2011 | Birkenstock | 165/104.34 |
| 2011/0226445 | A1 * | 9/2011 | Brand | 165/70 |
| 2011/0303399 | A1 * | 12/2011 | Sakimichi et al. | 165/135 |
| 2011/0313576 | A1 * | 12/2011 | Nicewonger | 700/282 |
| 2011/0315354 | A1 * | 12/2011 | Johnson | 165/104.33 |
| 2013/0141865 | A1 * | 6/2013 | Wu et al. | 361/679.33 |
| 2013/0271871 | A1 * | 10/2013 | Watanabe et al. | 360/99.08 |

FOREIGN PATENT DOCUMENTS

| | | | |
|---|---|---|---|
| CN | 102159053 A | 8/2011 | |
| DE | 202008000736 | * 3/2008 | H02M 1/00 |

* cited by examiner

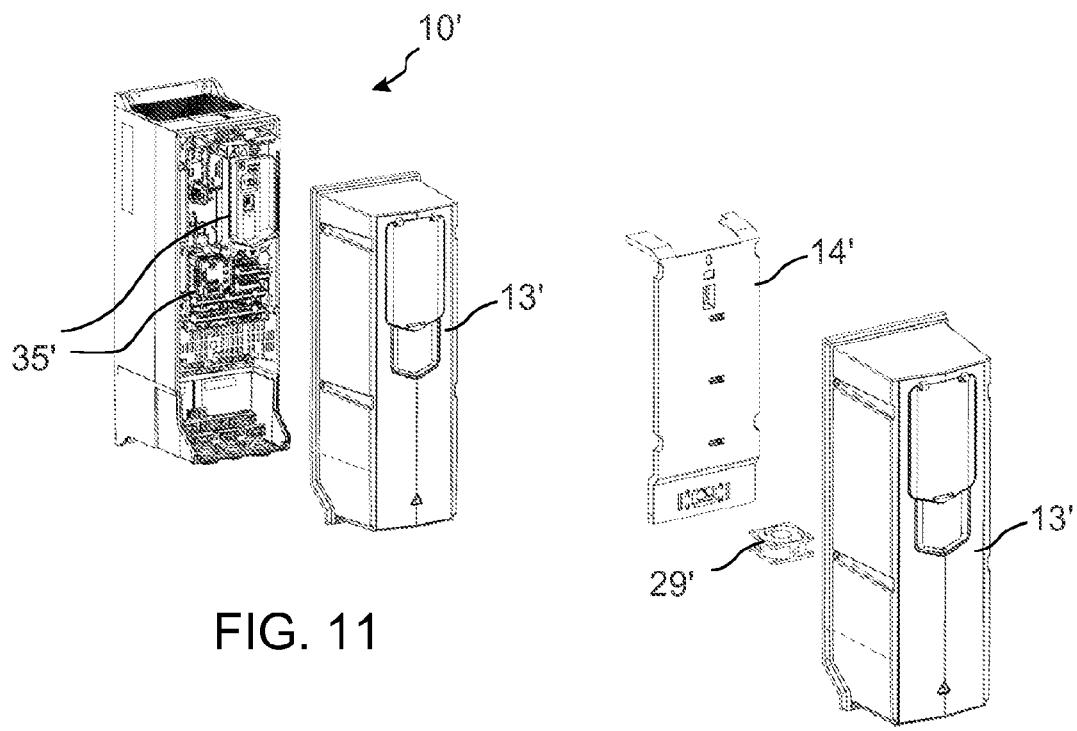
FIG. 11
FIG. 12
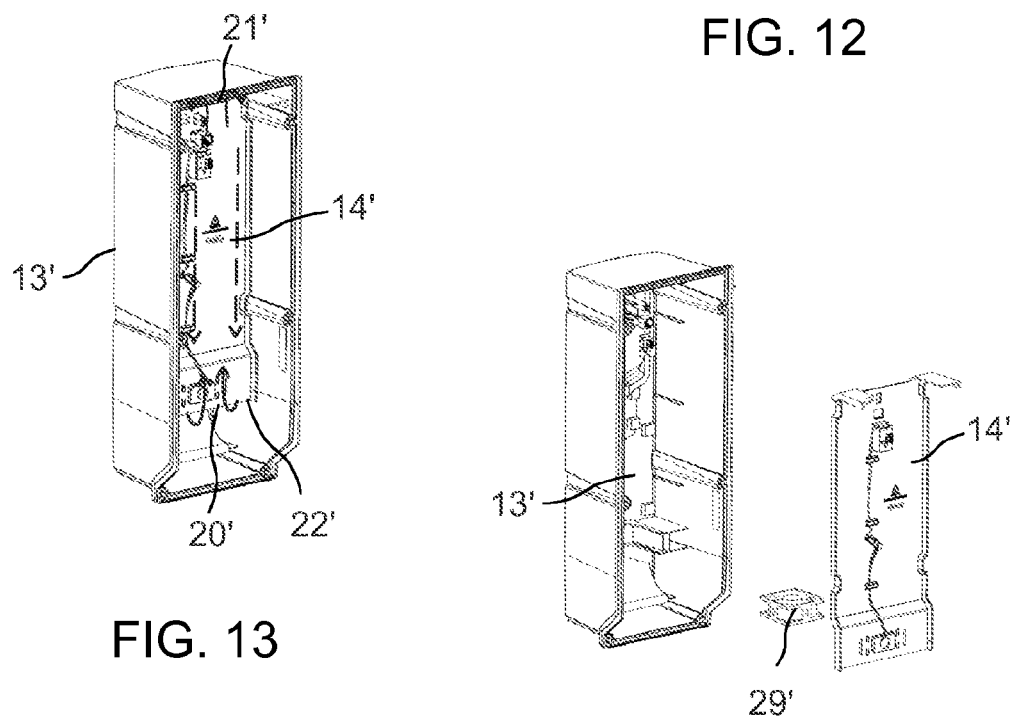
FIG. 13
FIG. 14

ELECTRONICS COMPARTMENT

RELATED APPLICATIONS

This application is a Continuation-in-Part of U.S. application Ser. No. 13/465,645 filed on May 7, 2012, the entire contents of which are incorporated herein by reference.

FIELD

An electronics compartment and solutions for cooling the interior of an electronics compartment are disclosed.

BACKGROUND INFORMATION

Known electronics compartment have walls which seal off a component space from the surrounding environment. In a known solution the temperature of the air inside the component space rises due to heat generated by electric components present in the component space. The heated air is in contact with the walls of the component space and consequently heat is conducted through the walls to the surrounding environment of the component space.

However, known electronics compartments can have insufficient cooling. Due to the insufficient cooling, the temperature inside the component space may rise to a level where damage may occur.

SUMMARY

An electronics compartment is disclosed including a component space which is sealed off from a surrounding environment by walls of the electronics compartment, an internal panel arranged in the component space along a wall of the electronics compartment for delimiting an internal channel between the wall and the internal panel, a first inlet in a vicinity of a first end of the internal channel for allowing air to enter the internal channel from a space located on an opposite side of the internal panel in relation to the internal channel, and a first outlet in a vicinity of a second end of the internal channel for allowing air to exit from the internal channel to the space located on the opposite side of the internal panel in relation to the internal channel.

BRIEF DESCRIPTION OF DRAWINGS

In the following exemplary embodiment of the present disclosure will be described in closer detail by way of example and with reference to the attached drawings, in which:

FIGS. 11 to 15 illustrate a fifth exemplary embodiment of an electronics compartment.

DETAILED DESCRIPTION

Exemplary embodiments of the disclosure include solutions for providing adequate cooling to an electronics compartment. An exemplary electronics compartment can include a component space which is sealed off from the surrounding environment by walls of the electronics compartment, an internal panel arranged in the component space along a wall of the electronics compartment for delimiting an internal channel between the wall and the internal panel, a first inlet in the vicinity of a first end of the internal channel for allowing air to enter the internal channel from a space located on an opposite side of the internal panel in relation to the internal channel, and a first outlet in the vicinity of a second end of the internal channel for allowing air to exit from the internal channel to the space located on the opposite side of the internal panel in relation to the internal channel.

FIGS. 1 to 4 illustrate a first exemplary embodiment of an electronics compartment 10.

Figure 1:
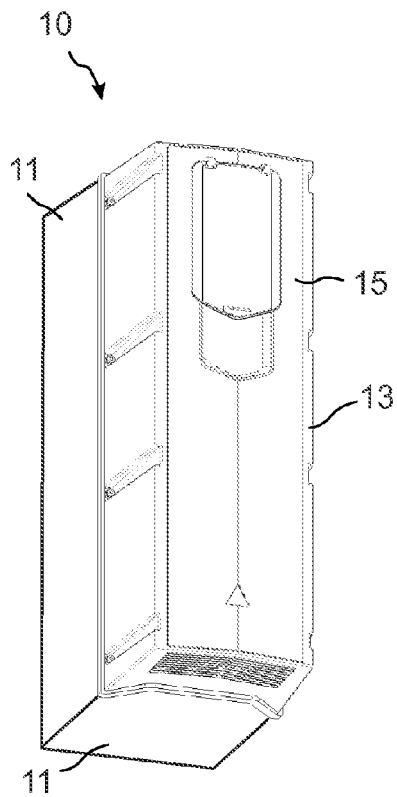
FIGS. 1 to 4 illustrate a first exemplary embodiment of an electronics compartment.

FIG. 1 illustrates the electronics compartment 10 once assembled. The electronics compartment may be an electronics compartment for a motor drive, such as a frequency converter, for instance. The electronics compartment 10 can include a plurality of walls 11 and 13 which seal off the interior of a component space from the surrounding environment. In the following it will, by way of example, be assumed that the walls 11 and 13 together form an air tight barrier between the inside of the component space and the surrounding environment.

In the illustrated example, one of the walls 13 is implemented as a removable cover facilitating installation of electric components in the component space, for instance. This wall 13 of the component space is utilized as an air-to-air heat exchanger for transferring heat from the inside of the component space to the surrounding environment outside the component space.

Figure 2:
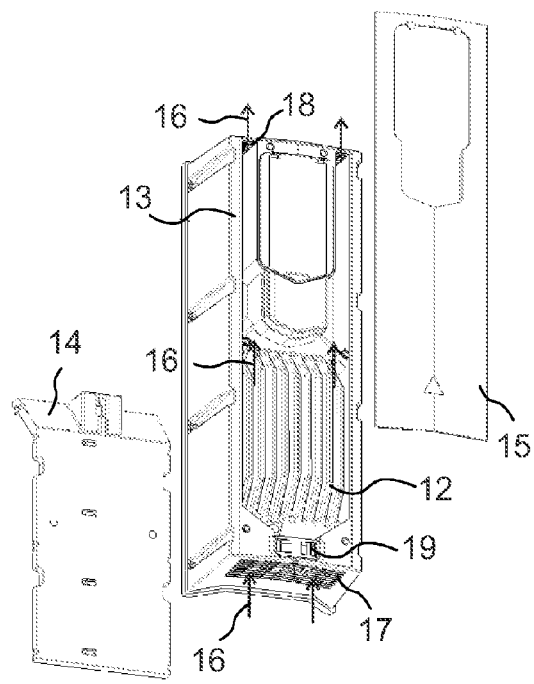

The electronics compartment 10 comprises an external panel 15 arranged along the wall 13 on the outside of the component space for delimiting an external channel 16 between the wall 13 and the external panel 15. The external panel 15 is illustrated as being attached to the wall 13 in FIG. 1 while FIG. 2 is an exploded view illustrating the external panel 15 and wall 13 detached from each other. The external channel 16 is illustrated by arrows indicating airflow through the external channel 16. A second inlet 17 in the lower part of the wall 13 allows air to enter the external channel 16. However, due to the air-tight design of the wall 13, air can be prevented from entering the component space via the second inlet 17 or other parts of the external channel. A second outlet 18 (or outlets as in the illustrated example) in the upper part of the wall 13 allows air to exit from the external channel 16 to the surrounding environment. Consequently air may flow between the wall 13 and the external panel 15, due to which the outside surface of the wall 13 is efficiently cooled. In order to improve the airflow, an external fan 19 may be utilized for generating an airflow through the external channel 16.

In the illustrated embodiment, the surface area of the wall 13 is increased by protrusions and recesses 12. Therefore, transfer of heat from the outer surface of the wall 13 to the air in the external channel 16 can be improved. However, in some embodiments it can be sufficient to have an outer surface of the wall 13 which is generally smooth (as in FIGS. 11 to 15, for instance), in other words without the illustrated protrusions and recesses.

Figure 3:
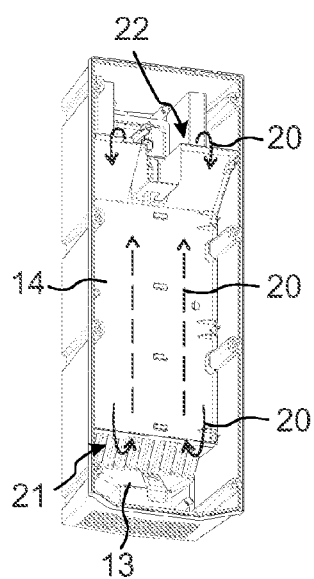
Figure 4:
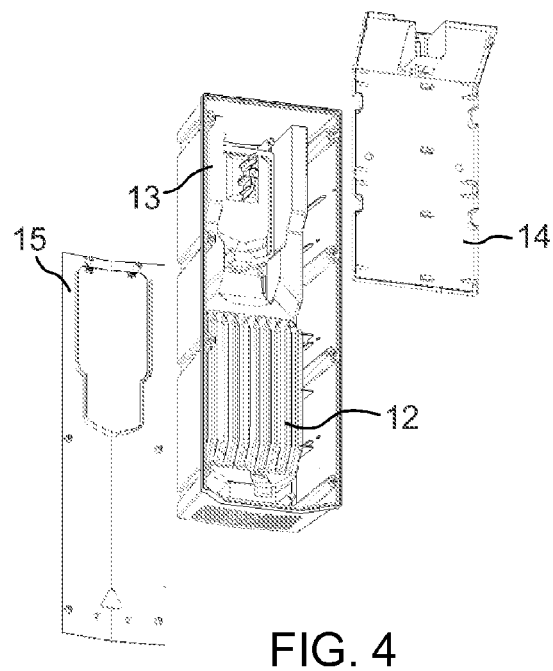
Figure 5:
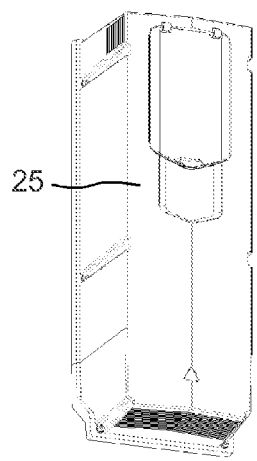
FIGS. 5 to 8 illustrate a second exemplary embodiment of an electronics compartment.
Figure 6:
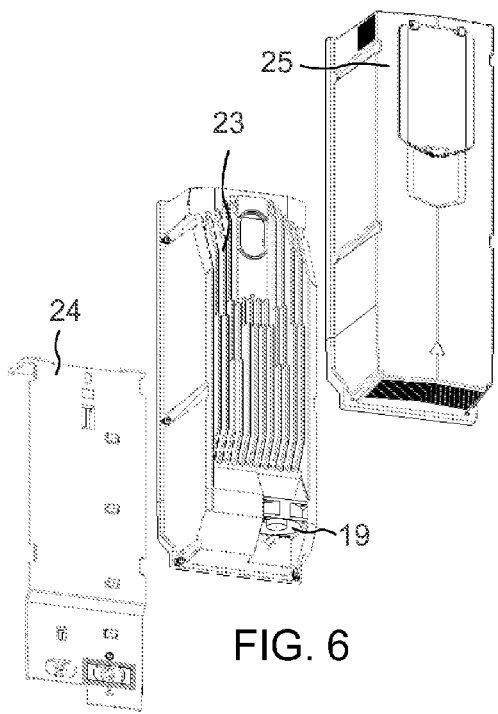
Figure 7:
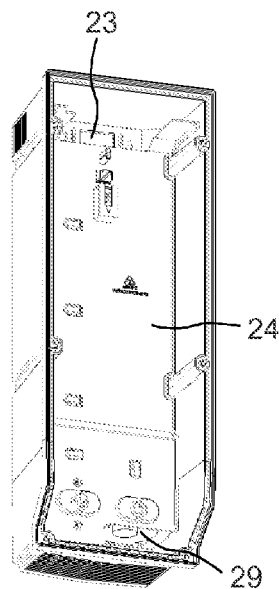
Figure 8:
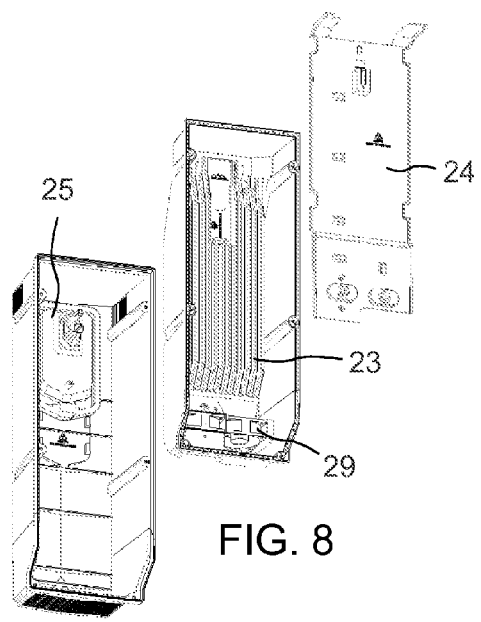

FIGS. 3 and 4 illustrate the inside of the wall 13. An internal panel 14 is arranged along the inside of the wall 13. In FIG. 3, the internal panel 14 is shown as being attached to the wall 13 and FIG. 4 illustrates an exploded view where the internal panel 14 is detached from the wall 13.

The internal panel 14 delimits an internal channel 20 between the wall 13 and the internal panel 14. In the figures the internal channel 20 is illustrated by arrows indicating airflow through the internal channel 20. A first inlet 21 is arranged at a lower end of the internal panel 14 for allowing air to enter the internal channel 20 from a space located on an opposite side of the internal panel 14 in relation to the internal channel 20. Similarly, a first outlet 22 is arranged at an upper end of the internal panel 14 for allowing air to exit from the internal channel 20 to the space located on the opposite side of the internal panel 14 in relation to the internal channel 20. Consequently, air can flow from the component space via the first inlet 21 into the internal channel 20 and from the internal channel 20 via the first outlet 22 into the component space. In this way, air which is heated by electric components in the component space may flow into the internal channel where the air is cooled as heat is transferred through the wall 13 into the external channel 16. The air-tight wall 13 separates the external channel from the internal channel and prevents flow of air between these channels. The air exiting the internal channel 20 has, therefore, a lower temperature than the air entering the internal channel. Components in the component space are, therefore, cooled due to the airflow. A fan may be utilized in order to cause air to flow through the internal channel 20. Such a fan may be located in the internal channel 20 or in the component space.

The protrusions and recesses 12 provided in the wall 13 in order to increase the outside surface area of the wall 13 are present also on the inside of the wall 13. Consequently, the inside surface area of the wall is increased and the transfer of heat from the air in the internal channel to the inner surface of the wall 13 is improved.

One exemplary alternative to manufacture the wall 13, the internal panel 14 and the external panel 15 is injection molding of a suitable plastic material. However, in practice, the external panel 15 acts as a cosmetic outer surface of the electronics compartment, in which case it may also have other functional tasks than to provide the external channel only. Therefore, some parts of the external panel or the entire external panel may be manufactured in a different way and of a different material than plastics.

In the embodiment illustrated in FIGS. 1 to 4, it has, by way of example, been assumed that the internal panel 14 is a separate part attached to the inside of the wall 13 only for the purpose of providing the internal channel 20. However, this is only one possible exemplary embodiment. Alternatively, it is possible for a part provided in the electronics compartment for a completely different reason to have a surface acting as the internal panel. In that case, the internal panel may be a printed circuit board or a base plate for receiving electric components, for instance.

In FIGS. 1 to 4 it has, by way of example, been assumed that the airflow in the internal channel 16 and the airflow in the external channel 20 (on opposite sides of the same wall 13) are directed in the same direction. Therefore, the arrows indicate that the air flows upwards both in the internal channel and in the external channel. This is, however, only an example. In practice, it may, in some implementations, be advantageous to let the airflow in opposite directions in the internal and external channels.

FIGS. 5 to 8 illustrate a second exemplary embodiment of an electronics compartment. The embodiment of FIGS. 5 to 8 is similar to the embodiment of FIGS. 1 to 4, and therefore the embodiment of FIGS. 5 to 8 will mainly be explained by pointing out the differences between these embodiments.

In FIGS. 5 to 8, the outer panel 25 is shaped to almost completely cover the outside of the wall 23. Additionally, in this embodiment, an internal fan 29 is provided in the internal channel between the internal panel 24 and the wall 23 in order to generate an airflow in the internal channel.

Figure 9:
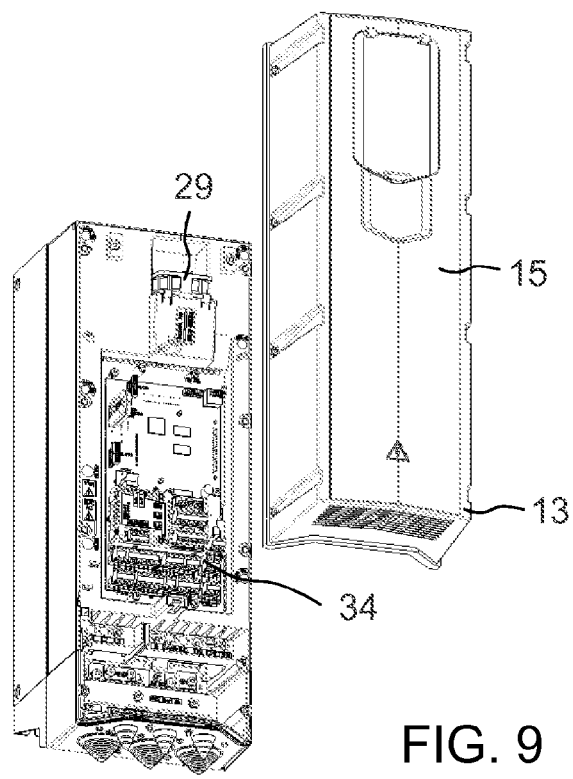
FIG. 9 illustrates a third exemplary embodiment of an electronics compartment.

FIG. 9 illustrates a third exemplary embodiment of an electronics compartment. The embodiment of FIG. 9 is similar to the embodiment of FIGS. 1 to 4, and therefore the embodiment of FIG. 9 will mainly be explained by pointing out the differences between these embodiments.

In the embodiment of FIG. 9, the wall 13 and the external panel 15 are implemented as in the embodiment of FIGS. 1 to 4. However, the internal panel 34 includes (e.g., consists entirely or partially of) a printed circuit board or a base plate carrying electric components. FIG. 9 also illustrates the internal fan 29 arranged in an upper part of the electronics compartment for circulating air through the internal channel which is delimited by the wall 13 and the internal panel 34.

Figure 10:
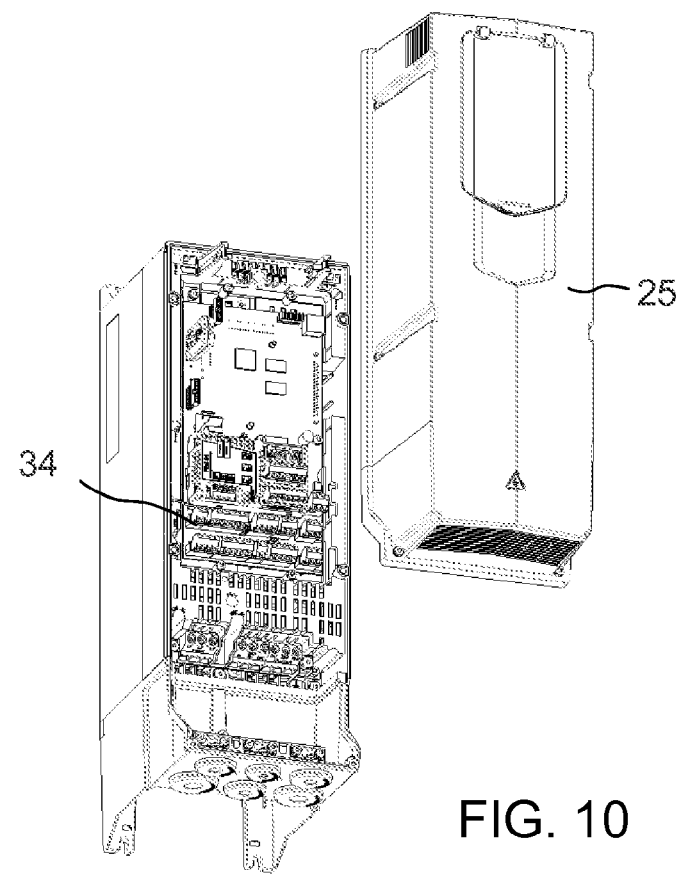
FIG. 10 illustrates a fourth exemplary embodiment of an electronics compartment.
Figure 15:
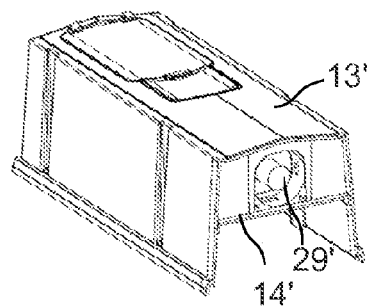

FIG. 10 illustrates a fourth exemplary embodiment of an electronics compartment. The embodiment of FIG. 10 is similar to the embodiment of FIGS. 5 to 8, and therefore the embodiment of FIG. 10 will mainly be explained by pointing out the differences between these embodiments.

In the embodiment of FIG. 10 the wall 23 and the external panel 25 are implemented as in the embodiment of FIGS. 5 to 8. However, the internal panel 34 includes (e.g., consists entirely or partially of) a printed circuit board or base plate carrying electric components. An internal fan for generating an airflow in the internal channel may be arranged behind (under in FIG. 10) the illustrated internal panel 34.

FIGS. 11 to 15 illustrate a fifth exemplary embodiment of an electronics compartment. The embodiment of FIGS. 11 to 15 is similar to the embodiment of FIGS. 1 to 4, and therefore the embodiment of FIGS. 11 to 15 will mainly be explained by pointing out the differences between these embodiments.

In FIG. 11, electronics compartment 10' is illustrated separately from the wall 13' which can be implemented as a removable cover facilitating installation of electric components 35' into the component space.

FIGS. 12 to 14 illustrate the wall 13' and the internal panel 14' as seen from the outside (FIG. 12) and the inside (FIGS. 13 to 14). The internal panel 14' is attached to the wall 13' in FIG. 13.

Similarly as in the embodiment of FIGS. 1 to 4, the internal panel 14' and the wall delimit an internal channel 20' into which air can flow from the component space via the first inlet 21'. The flowing air can exit the internal channel 20' via the first outlet 22' into the component space. In this exemplary embodiment, as illustrated in FIG. 13, the air flows downwards in the internal channel and upwards in the component space. A fan 29' may be utilized in order to cause air to flow through the internal channel. In the embodiment of FIGS. 12 to 15 it is by way of example assumed that such a fan 29' is located in the first channel 22', as can be seen in the cross section illustrated in FIG. 15.

In the embodiment of FIGS. 11 to 15, no external channel is provided on the outside of the wall 13'. Instead the air transferred to the outer surface of the wall 13' is dissipated into the surrounding air via the generally smooth wall 13'. In this context the term "generally smooth" relates to a surface which does not have any extra protrusions or recesses for the sole purpose of increasing the heat dissipating surface area. However, in some embodiments such protrusions or recesses may be provided on the wall 13'.

Figure 16:
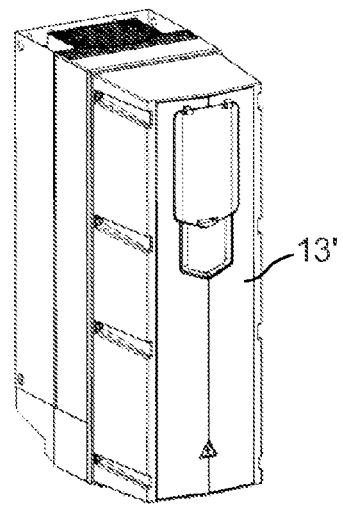
FIGS. 16 to 18 illustrate a sixth exemplary embodiment of an electronics compartment.
Figure 17:
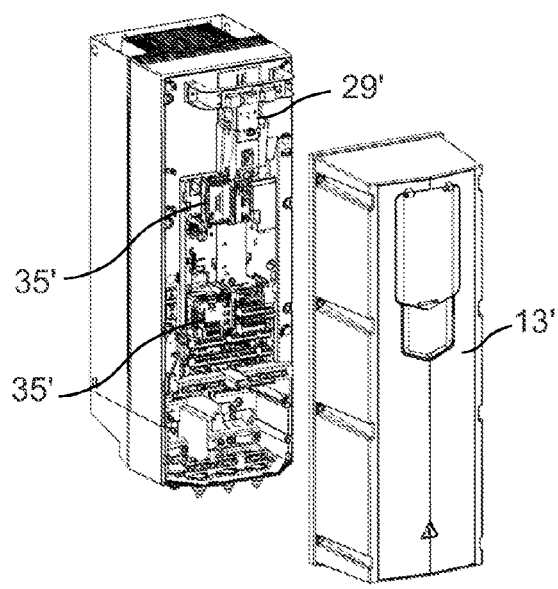
Figure 18:
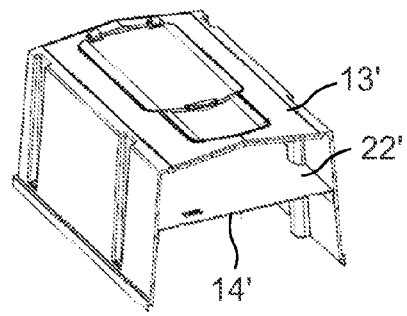

FIGS. 16 to 18 illustrate a sixth exemplary embodiment of an electronics compartment. The embodiment of FIGS. 16 to 18 is similar to the one described in connection with FIGS. 11 to 15. Therefore the embodiment of FIGS. 16 to 18 will be mainly explained by pointing out the differences between these two embodiments.

In the embodiment of FIGS. 16 to 18 the internal fan 29' is not arranged in the internal channel 22', but instead into the component space, such as on a circuit board together with other electric components 35'.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. An electronics compartment comprising:
   a component space which is sealed off from a surrounding environment by walls of the electronics compartment;
   an internal panel arranged in the component space along a wall of the electronics compartment for delimiting an internal channel between the wall and the internal panel;
   a first inlet in a vicinity of a first end of the internal channel for allowing air to enter the internal channel from a space located on an opposite side of the internal panel in relation to the internal channel;
   a first outlet in a vicinity of a second end of the internal channel for allowing air to exit from the internal channel to the space located on the opposite side of the internal panel in relation to the internal channel;
   an external panel arranged along the same wall of the electronics compartment as the internal panel, but outside of the component space, for delimiting an external channel between the wall and the external panel, the wall being air-tight, at least between the external channel and the internal channel, for separating the external channel from the internal channel by preventing airflow between these channels;
   a second inlet in a vicinity of a first end of the external channel for allowing air to enter the external channel from the surrounding environment of the electronics compartment;
   a second outlet in a vicinity of a second end of the external channel for allowing air to exit from the external channel to the surrounding environment of the electronics compartment; and
   wherein the wall between the internal channel and the external channel is provided with protrusions and recesses for increasing the surface area of the wall to improve transfer of heat from the internal channel to the external channel.

2. The electronics compartment according to claim 1, wherein the electronics compartment comprises:
   an internal fan for generating airflow through the internal channel.

3. The electronics compartment according to claim 1, wherein the wall of the electronics compartment which delimits the internal channel is a smooth wall.

4. The electronics compartment according to claim 1, wherein the wall which delimits the internal channel with the internal panel is an injection-molded plastic part.

5. The electronics compartment according to claim 1, wherein the internal panel is a printed circuit board or a base plate for receiving electric components.

6. The electronics compartment according to claim 1, wherein the internal panel is a part of a device provided in the electronics compartment.

7. The electronics compartment according to claim 1, wherein the electronics compartment comprises:
   an external fan for generating airflow through the external channel.

8. The electronics compartment according to claim 1, wherein the electronics compartment is an electronics compartment for a motor drive.

* * * * *